US007696821B2

(12) United States Patent
Rofougaran

(10) Patent No.: US 7,696,821 B2
(45) Date of Patent: Apr. 13, 2010

(54) METHOD AND SYSTEM FOR EXTENDING DYNAMIC RANGE OF AN RF SIGNAL

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 83 days.

(21) Appl. No.: 11/864,857

(22) Filed: Sep. 28, 2007

(65) Prior Publication Data

US 2009/0033526 A1 Feb. 5, 2009

Related U.S. Application Data

(60) Provisional application No. 60/953,090, filed on Jul. 31, 2007.

(51) Int. Cl.
*H03G 3/20* (2006.01)

(52) U.S. Cl. ...................................... 330/136; 330/297

(58) Field of Classification Search .................. 330/10, 330/136, 297; 375/297; 455/127.1, 127.2
See application file for complete search history.

(56) References Cited

U.S. PATENT DOCUMENTS

| | | | | |
|---|---|---|---|---|
| 6,078,628 | A | 6/2000 | Griffith | |
| 6,900,693 | B2 * | 5/2005 | Sasho et al. | 330/133 |
| 6,996,191 | B1 * | 2/2006 | Meditz | 375/308 |
| 7,076,698 | B2 * | 7/2006 | Busking | 714/704 |
| 7,519,336 | B2 * | 4/2009 | Vepsalainen et al. | 455/127.1 |
| 2007/0223625 | A1 * | 9/2007 | Rofougaran | 375/302 |

* cited by examiner

*Primary Examiner*—Khanh V Nguyen
(74) *Attorney, Agent, or Firm*—McAndrews, Held & Malloy, Ltd.

(57) ABSTRACT

Aspects of a method and system for extending dynamic range of an RF signal are provided. In this regard, a signal representative of an amplitude of a pair of baseband signals may be generated. The amplitude of the generated signal may be expanded, and the amplitude of the baseband signals may be compressed. In this regard, the compression and the expansion may be inverse functions of each other. Additionally, the compressed baseband signals may be combined to generate an intermediate signal which may be amplitude modulated by the expanded signal. The amplitude modulation may result from controlling a gain, a voltage source, and/or a current source of a power amplifier. The intermediate signal may be generated by up-converting the baseband signals and subsequently combining the up-converted signals.

21 Claims, 4 Drawing Sheets

METHOD AND SYSTEM FOR EXTENDING DYNAMIC RANGE OF AN RF SIGNAL

CROSS-REFERENCE TO RELATED APPLICATIONS/INCORPORATION BY REFERENCE

This patent application makes reference to, claims priority to and claims benefit from U.S. Provisional Patent Application Ser. No. 60/953,090 filed on Jul. 31, 2007.

The above stated application is hereby incorporated herein by reference in its entirety.

FIELD OF THE INVENTION

Certain embodiments of the invention relate to signal processing. More specifically, certain embodiments of the invention relate to a method and system for extending dynamic range of an RF signal.

BACKGROUND OF THE INVENTION

As electronic communications are increasingly relied upon to provide fast and reliable delivery of information, significant efforts exist to increase data rates in a variety of communications system. In this regard, a problem often encountered by communication system designers when attempting to increase data rates, is that supporting very high data rates often requires the utilization of high-order modulation schemes. However, modulation may require highly linear amplifiers and achieving good linearity in a power amplifier often results in reduced efficiency. Accordingly, it may be difficult to achieve highly linear power amplifiers in, for example, portable devices where power efficiency is very important due to limited battery capacity. Therefore, systems designers are often forced to balance a tradeoff between high data rates and power efficiency.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for extending the dynamic range of an RF signal, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for extending dynamic range of an RF signal. In this regard, a signal representative of an amplitude of a pair of baseband signals may be generated; the amplitude of the generated signal may be expanded, and the amplitude of the baseband signals may be compressed. In this regard, the compression and the expansion may be inverse functions of each other. Additionally, the compressed baseband signals may be combined to generate an intermediate signal which may be amplitude modulated by the expanded signal. The amplitude modulation may result from controlling a gain, a voltage source, and/or a current source of a power amplifier. The signal representative of the amplitude of the baseband signals may be generated by squaring each of the baseband signals and calculating the square root of a sum of the squared baseband signals. The intermediate signal may be generated by up-converting the baseband signals and subsequently combining the up-converted signals. In this regard, the up-conversion may comprise mixing an in-phase signal of said compressed signals with a first local oscillator signal and mixing a quadrature-phase signal of said compressed signals with a second local oscillator signal, wherein said first local oscillator signal and said second local oscillator signal are in phase-quadrature.

Figure 1A:
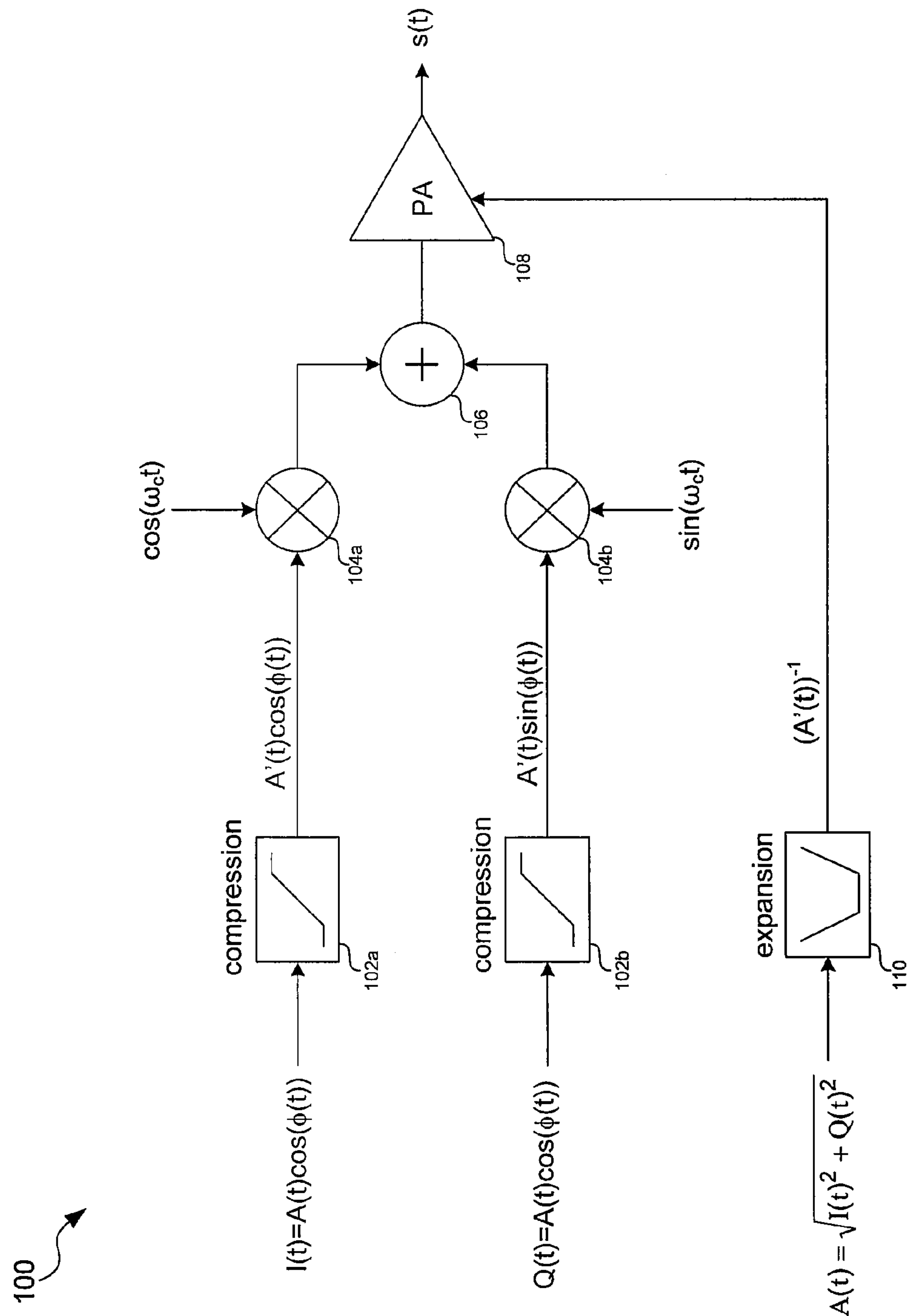
FIG. 1*a* is a block diagram illustrating extending the dynamic range of an RF signal, in accordance with an embodiment of the invention.

FIG. 1*a* is a block diagram illustrating an exemplary structure for extending the dynamic range of an RF signal, in accordance with an embodiment of the invention. Referring to FIG. 1*a* there is shown a portion of an RF transmitter 100 comprising compression blocks 102*a* and 102*b*, mixers 104*a* and 104*b*, summer 106, power amplifier (PA) 108, and expansion block 110.

The compression blocks 102*a* and 102*b* may comprise suitable logic, circuitry, and/or code that may enable reducing the ratio of peak to average voltage, current, and/or power of a signal. In this regard, the compression block 102*a* and 102*b* may attenuate higher amplitude portions of signals while passing portions of a signal near DC. For example, the compression blocks 102*a* and 102*b* may operate in a manner similar to an amplifier with linear gain for low signal amplitude and increasing attenuation at higher signal amplitudes.

The mixers 104*a* and 104*b* may each comprise suitable logic, circuitry, and/or code that may enable generating intermodulation products resulting from the mixing of two signals. In this regard, the mixers 104*a* and 104*b* may enable up-conversion of a baseband signal by mixing the baseband signal with a local oscillator (LO) signal.

The summer 106 may comprise suitable logic, circuitry, and/or code that may enable combining two signals. In this regard, the output of the summer 108 may be equal to the addition of the two inputs of the summer 108.

The power amplifier 108 may comprise suitable logic, circuitry, and/or code that may enable buffering and/or amplification of an RF signal and output of the signal to, for example, an antenna for transmission. In this regard, the gain of the PA 108 may be adjustable and may enable transmitting signals of varying strength. Accordingly, the PA 108 may receive one or more control signals. In various embodiments of the invention, controlling the gain of the PA 108 may enable amplitude modulation of an RF signal.

The expansion block 110 may comprise suitable logic, circuitry, and/or code that may enable performing the inverse, or opposite, of the compression function performed by the compression blocks 102*a* and 102*b*. In this regard, the expansion block 110 may amplify portions of a signal that the compression blocks 102*a* and 102*b* may attenuate.

In an exemplary operation, the signals I(t) and Q(t) may be compressed prior to being up-converted and summed. In this regard, the ratio of peak to average voltage, power, and/or current may be reduced. In this manner, because of the reduced swing of the signal into the PA 108, the PA 108 may be operated closer to its 1 dB compression point, which may result in increased efficiency. However, the signal into the PA 108 has effectively been distorted, and thus to recover information comprising the signal, the distortion may need to be reversed. Accordingly, the gain of the PA 108 may be modulated by the output of the expansion block 110. Accordingly, the amplitude modulation via controlling the gain of the PA 108, may, in effect, reverse the compression performed by the compression blocks 102*a* and 102*b*. Accordingly, the output of the PA 108 may be as given below in EQ. 1.

$$s(t)=A\sin(\omega ct+\phi) \quad \text{EQ. 1}$$

where 'ω' is angular frequency, 'c' is a constant, 't' is time, and ϕ is phase of the signals I and Q.

Figure 1B:
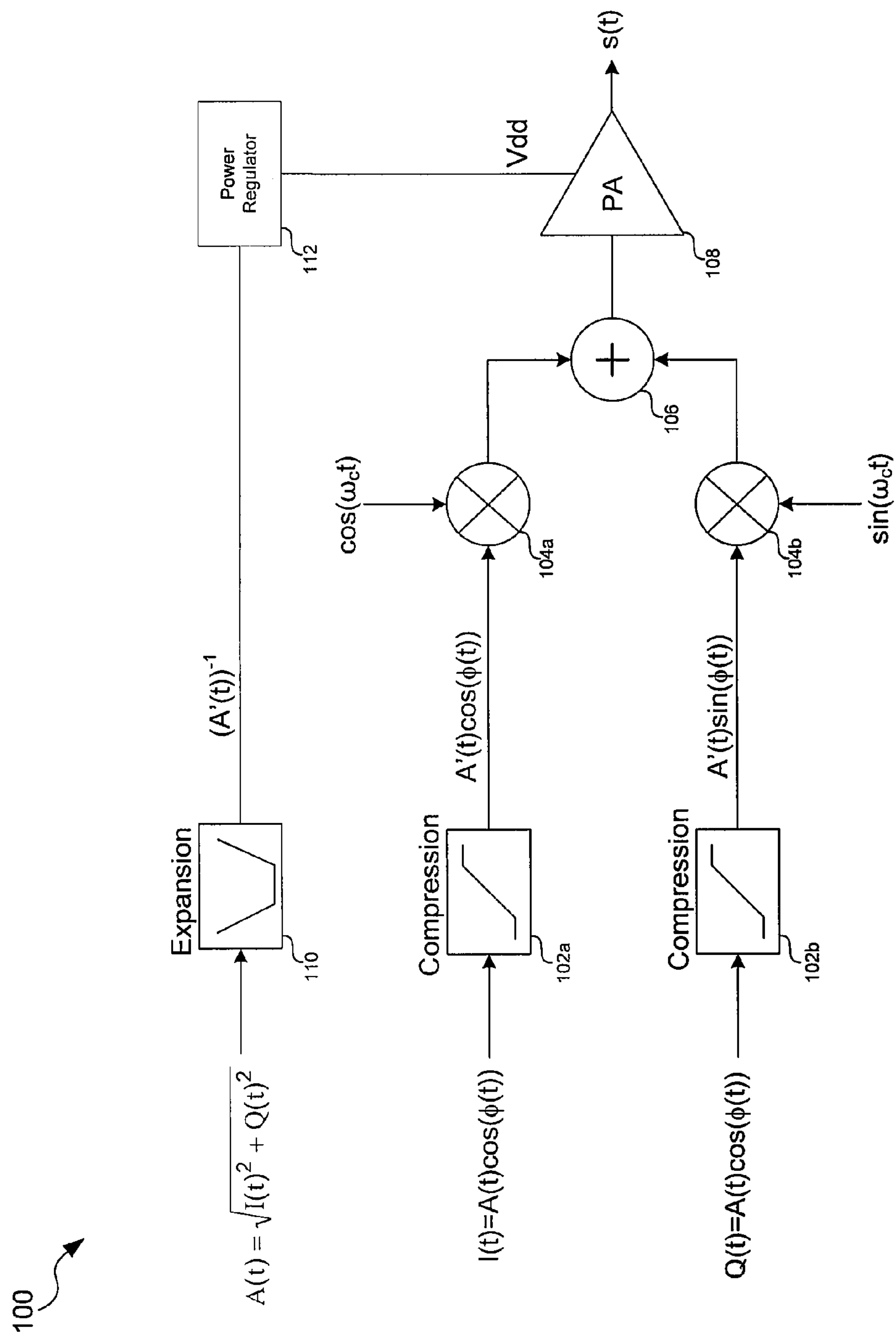
FIG. 1*b* is a block diagram illustrating extending the dynamic range of an RF signal, in accordance with an embodiment of the invention.

FIG. 1*b* is a block diagram illustrating an exemplary structure for extending the dynamic range of an RF signal, in accordance with an embodiment of the invention. Referring to FIG. 1*b* there is shown a portion of an RF transmitter 100 comprising compression blocks 102*a* and 102*b*, mixers 104*a* and 104*b*, summer 106, power amplifier (PA) 108, expansion block 110, and power regulator 112.

Each of he compression blocks 102*a* and 102*b*, the mixers 104*a* and 104*b*, the summer 106, the power amplifier 108, and the expansion block 110 may be as described with respect to FIG. 1*a*.

The power regulator 112 may comprise suitable logic, circuitry, and/or code that may enable controlling a voltage and/or current provided to the PA 108. For example, the power regulator 112 may comprise a switching voltage regulator, a voltage controlled current source, or a binary weighted current source. Accordingly, a voltage and/or current output by the power regulator 112 may be determined, at least in part, by a control signal communicatively coupled to the power regulator 112.

In operation, a signal output by the expansion block 110 may modulate the output voltage and/or current of the power regulator 112. Accordingly, the output of the PA 108 may be modulated by controlling the power supplied to the PA 108. For example, for a switching regulator, a duty cycle of the power regulator 112 may be controlled, at least in part, based on the signal from the expansion block 112. Similarly, for a binary weighted current source, the amount of current supplied to the PA 108 may be based on the value of the signal output by the expansion block 110. In this regard, the output of the expansion block may comprise 'n' bits, each of which may control whether one of 'n' switches comprising the current source is open or closed. In another example, the power regulator 112 may comprise a voltage dependant current source. Accordingly, the current supplied to the PA 108 may be based, at least in part, on a voltage output by the expansion block 112.

Figure 2:
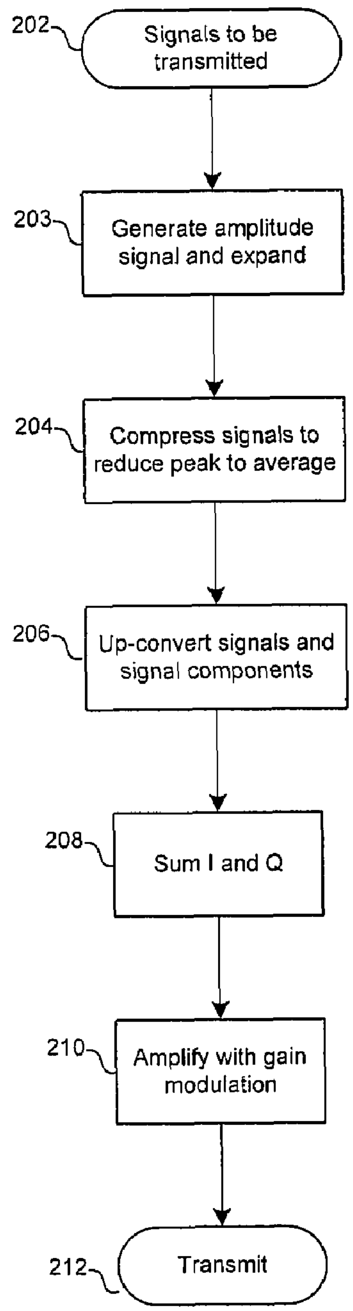
FIG. 2 is a flow chart illustrating exemplary steps for extending the dynamic range of an RF signal, in accordance with an embodiment of the invention.

FIG. 2 is a flow chart illustrating exemplary steps for extending the dynamic range of an RF signal, in accordance with an embodiment of the invention. Referring to FIG. 2 the exemplary steps may begin with start step 202. Subsequent to step 202, the exemplary steps may advance to step 203. In step 203 a signal that is representative of an amplitude of a pair phase-quadrature baseband signals may be generated. Additionally, the amplitude of the generated signal may be expanded. Subsequent to step 203, the exemplary steps may advance to step 204. In step 204, the ratio of peak to average voltage, current, and/or power of the in-phase (I) and quadrature-phase (Q) baseband signals may be compressed. In this regard, signal swing of the I and Q signals may be reduced such that a power amplifier (PA) amplifying the signals may operate closer to its 1dB compression point without saturating or distorting the signal.

Subsequent to step 204, the exemplary steps may advance to step 206. In step 206, the compressed I and Q baseband signals may be up-converted to RF. In this regard, the I signal may be mixed with an in-phase local oscillator (LO) signal for up-conversion. Similarly, the Q signal may be mixed with a quadrature-phase LO signal for up-conversion. Subsequent to step 206, the exemplary steps may advance to step 208. In step 208, the up-converted I and Q signals may be combined. In this regard, the signals may be added together to generate a single RF signal. Subsequent to step 208, the exemplary steps may advance to step 210.

In step 210, the RF signal may be amplified by a power amplifier. In various embodiments of the invention, the output of the PA may be modulated by the expanded amplitude signal generated in step 203. In this regard, the expansion of the signal in step 203 may be an inverse operation of the compression performed in step 204. The output of the PA may be modified by modulating a gain, a bias point, a supply voltage, a supply current, and/or other parameter of the PA. Subsequent to step 210, the exemplary steps may advance to step 212. In step 212 the output of the PA may be transmitted by, for example, an antenna such as the antenna 321*b* of FIG. 3.

Figure 3:
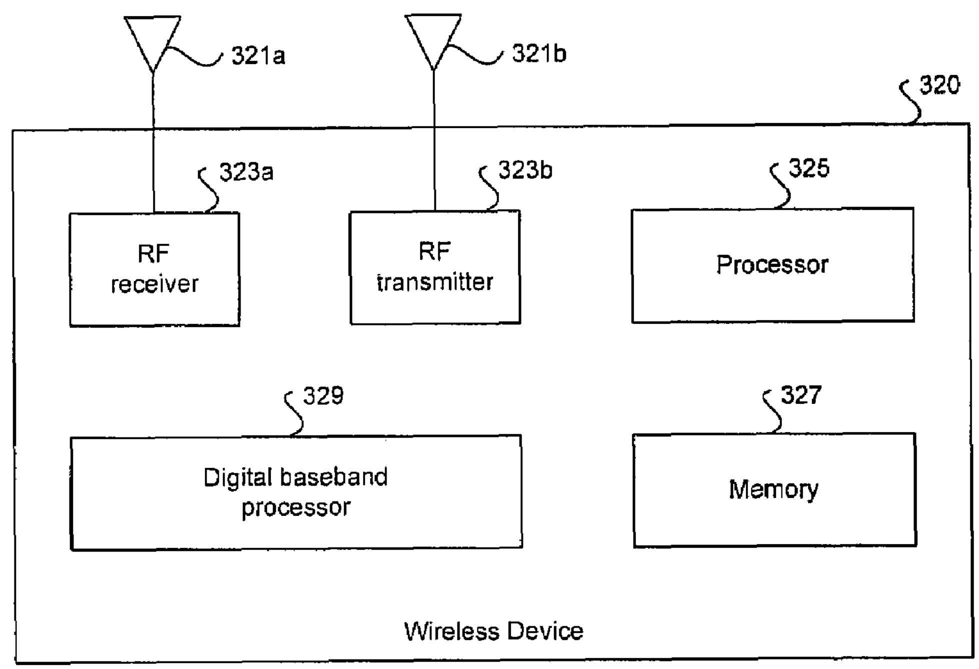
FIG. 3 is a block diagram illustrating an exemplary wireless device, in accordance with an embodiment of the invention.

FIG. 3 is a block diagram illustrating an exemplary wireless device, in accordance with an embodiment of the invention. Referring to FIG. 3, there is shown a wireless device 320 that may comprise an RF receiver 323*a*, an RF transmitter 323*b*, a digital baseband processor 329, a processor 325, and a memory 327. A receive antenna 321*a* may be communicatively coupled to the RF receiver 323*a*. A transmit antenna 321*b* may be communicatively coupled to the RF transmitter 323*b*. The wireless device 320 may be operated in a system, such as the cellular network and/or digital video broadcast network, for example.

The RF receiver 323*a* may comprise suitable logic, circuitry, and/or code that may enable processing of received RF signals. The RF receiver 323*a* may enable receiving RF signals in a plurality of frequency bands. For example, the RF receiver 323*a* may enable receiving signals in cellular frequency bands. Each frequency band supported by the RF receiver 323*a* may have a corresponding front-end circuit for handling low noise amplification and down conversion operations, for example. In this regard, the RF receiver 323*a* may be referred to as a multi-band receiver when it supports more than one frequency band. In another embodiment of the invention, the wireless device 320 may comprise more than one RF receiver 323*a*, wherein each of the RF receiver 323*a* may be a single-band or a multi-band receiver.

The RF receiver 323*a* may down convert the received RF signal to a baseband signal that comprises an in-phase (I) component and a quadrature (Q) component. The RF receiver 323*a* may perform direct down conversion of the received RF signal to a baseband signal, for example. In some instances, the RF receiver 323*a* may enable analog-to-digital conversion of the baseband signal components before transferring the components to the digital baseband processor 329. In other instances, the RF receiver 323*a* may transfer the baseband signal components in analog form.

The digital baseband processor 329 may comprise suitable logic, circuitry, and/or code that may enable processing and/or handling of baseband signals. In this regard, the digital baseband processor 329 may process or handle signals received from the RF receiver 323*a* and/or signals to be transferred to the RF transmitter 323*b*, when the RF transmitter 323*b* is present, for transmission to the network. The digital baseband processor 329 may also provide control and/or feedback information to the RF receiver 323*a* and to the RF transmitter 323*b* based on information from the processed signals. In this regard, the baseband processor 327 may provide a control signal to one or more of the compression blocks 102*a* and 102*b*, the expansion block 110, the mixers 108*a* and 108*b*, the summer 106, and/or the Pa 108. The digital baseband processor 329 may communicate information and/or data from the processed signals to the processor 325 and/or to the memory 327. Moreover, the digital baseband processor 329 may receive information from the processor 325 and/or to the memory 327, which may be processed and transferred to the RF transmitter 323*b* for transmission to the network.

The RF transmitter 323*b* may comprise suitable logic, circuitry, and/or code that may enable processing of RF signals for transmission. The RF transmitter 323*b* may enable transmission of RF signals in a plurality of frequency bands. For example, the RF transmitter 323*b* may enable transmitting signals in cellular frequency bands. Each frequency band supported by the RF transmitter 323*b* may have a corresponding front-end circuit for handling amplification and up conversion operations, for example. In this regard, the RF transmitter 323*b* may be referred to as a multi-band transmitter when it supports more than one frequency band. In another embodiment of the invention, the wireless device 320 may comprise more than one RF transmitter 323*b*, wherein each of the RF transmitter 323*b* may be a single-band or a multi-band transmitter.

The RF transmitter 323*b* may quadrature up convert the baseband signal comprising I/Q components to an RF signal. The RF transmitter 323*b* may perform direct up conversion of the baseband signal to a RF signal, for example. The RF transmitter may be enabled to polar modulate one or more carrier signals by the baseband signal. In this regard, the RF transmitter may be enabled to separate the generation of phase and amplitude components of a signal to be transmitted. In this manner, the RF transmitter may be enabled to perform phase modulation independent of amplitude modulation. In some instances, the RF transmitter 323*b* may enable digital-to-analog conversion of the baseband signal components received from the digital baseband processor 329 before up conversion. In other instances, the RF transmitter 323*b* may receive baseband signal components in analog form.

The processor 325 may comprise suitable logic, circuitry, and/or code that may enable control and/or data processing operations for the wireless device 320. The processor 325 may be utilized to control at least a portion of the RF receiver 323*a*, the RF transmitter 323*b*, the digital baseband processor 329, and/or the memory 327. In this regard, the processor 325 may generate at least one signal for controlling operations within the wireless device 320. In this regard, the processor 325 may provide a control signal to one or more of the compression blocks 102*a* and 102*b*, the expansion block 110, the mixers 108*a* and 108*b*, the summer 106, and/or the Pa 108. The processor 325 may also enable executing of applications that may be utilized by the wireless device 320. For example, the processor 325 may execute applications that may enable displaying and/or interacting with content received via cellular transmission signals in the wireless device 320.

The memory 327 may comprise suitable logic, circuitry, and/or code that may enable storage of data and/or other information utilized by the wireless device 320. For example, the memory 327 may be utilized for storing processed data generated by the digital baseband processor 329 and/or the processor 325. The memory 327 may also be utilized to store information, such as configuration information, that may be utilized to control the operation of at least one block in the wireless device 320. For example, the memory 327 may comprise information necessary to configure the RF receiver 323*a* to enable receiving cellular transmission in the appropriate frequency band. In this regard, the memory 327 may store control and/or configuration information for to one or more of the compression blocks 102*a* and 102*b*, the expansion block 110, the mixers 108*a* and 108*b*, the summer 106, and/or the Pa 108.

Aspects of a method and system for extending dynamic range of an RF signal are provided. In this regard, a signal, A(t), representative of an amplitude of a pair of baseband signals, I(t) and Q(t), may be generated. The amplitude of the generated signal, A(t), may be expanded, and the amplitude of the baseband signals I(t) and Q(t) may be compressed. In this regard, the compression and the expansion may be inverse functions of each other. Additionally, the compressed baseband signals may be combined, by the summer 106, to generate an intermediate signal which may be amplitude modulated by the expanded signal. The amplitude modulation may result from controlling a gain, a voltage source, and/or a current source of the power amplifier 108. The signal representative of the amplitude of the baseband signals may be generated by squaring each of the baseband signals and calculating the square root of a sum of the squared baseband signals. The intermediate signal may be generated by up-converting the baseband signals and subsequently combining the up-converted signals. In this regard, the up-conversion may comprise mixing, via the mixer 104*a*, an in-phase signal of said compressed signals with a first local oscillator signal and mixing, via the mixer 104*b*, a quadrature-phase signal of said compressed signals with a second local oscillator signal, wherein said first local oscillator signal and said second local oscillator signal are in phase-quadrature Another embodiment of the invention may provide a machine-readable storage, having stored thereon, a computer program having at least one code section executable by a machine, thereby causing the machine to perform the steps as described herein for extending dynamic range of an RF signal.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communication, the method comprising:
performing, by one or more circuits in a transmitting device:
squaring each signal of a pair of baseband signals and calculating a square root of a sum of said squared signals, to generate a signal that is representative of an amplitude of said pair of baseband signals, wherein said baseband signals correspond to information to be transmitted;
expanding an amplitude of said generated signal;
compressing an amplitude of each signal of said pair of baseband signals;
generating an intermediate signal from said compressed signals;
amplitude modulating said intermediate signal by said expanded signal; and
transmitting said amplitude modulated signal.

2. The method according to claim 1, comprising generating said intermediate signal by up-converting said compressed signals and combining said up-converted signals.

3. The method according to claim 2, comprising up-converting said compressed signals by mixing an in-phase signal of said compressed signals with a first local oscillator signal and mixing a quadrature-phase signal of said compressed signals with a second local oscillator signal, wherein said first local oscillator signal and said second local oscillator signal are in phase-quadrature.

4. The method according to claim 1, comprising amplitude modulating said intermediate signal by controlling a gain of a power amplifier.

5. The method according to claim 1, comprising amplitude modulating said intermediate signal by controlling a current source supplying a power amplifier.

6. The method according to claim 1, comprising amplitude modulating said intermediate signal by controlling a voltage source supplying a power amplifier.

7. The method according to claim 1, wherein said expansion is an inverse function of said compression.

8. A computer-readable storage having stored thereon, a computer program having at least one code section for communication, the at least one code section being executable by a machine for causing the machine to perform steps comprising:
in a transmitting device:
squaring each signal of a pair of baseband signals and calculating a square root of a sum of said squared signals, to generate a signal that is representative of an amplitude of said pair of baseband signals, wherein said baseband signals correspond to information to be transmitted;
expanding an amplitude of said generated signal;
compressing an amplitude of each signal of said pair of baseband signals;
generating an intermediate signal from said compressed signals;
amplitude modulating said intermediate signal by said expanded signal; and
transmitting said amplitude modulated.

9. The computer-readable storage according to claim 8, wherein said at least one code section comprises code for generating said intermediate signal by up-converting said compressed signals and combining said up-converted signals.

10. The computer-readable storage according to claim 9, wherein said at least one code section comprises code for up-converting said compressed signals by mixing an in-phase signal of said compressed signals with a first local oscillator signal and mixing a quadrature-phase signal of said compressed signals with a second local oscillator signal, wherein said first local oscillator signal and said second local oscillator signal are in phase-quadrature.

11. The computer-readable storage according to claim 8, wherein said at least one code section comprises code for amplitude modulating said intermediate signal by controlling a gain of a power amplifier.

12. The computer-readable storage according to claim 8, wherein said at least one code section comprises code for amplitude modulating said intermediate signal by controlling a current source supplying a power amplifier.

13. The computer-readable storage according to claim 8, wherein said at least one code section comprises code for amplitude modulating said intermediate signal by controlling a voltage source supplying a power amplifier.

14. The computer-readable storage according to claim 8, wherein said expansion is an inverse function of said compression.

15. A system for communication, the system comprising:
one or more circuits for use in a transmitter, said one or more circuits operable to:
square each signal of a pair of baseband signals and calculate a square root of a sum of said squared signals, to generate a signal that is representative of an amplitude of said pair of baseband signals, wherein said baseband signals correspond to information to be transmitted;
expand an amplitude of said generated signal;
compress an amplitude of each signal of said pair of baseband signals;
generate an intermediate signal from said compressed signals;
amplitude modulate said intermediate signal by said expanded signal; and
transmit said amplitude modulated.

16. The system according to claim 15, wherein said one or more circuits are operable to generate said intermediate signal by up-converting said compressed signals and combining said up-converted signals.

17. The system according to claim 16, wherein said one or more circuits are operable to up-convert said compressed signals by mixing an in-phase signal of said compressed signals with a first local oscillator signal and mixing a quadrature-phase signal of said compressed signals with a second local oscillator signal, wherein said first local oscillator signal and said second local oscillator signal are in phase-quadrature.

18. The system according to claim 15, wherein said one or more circuits are operable to amplitude modulate said intermediate signal by controlling a gain of a power amplifier.

19. The system according to claim 15, wherein said one or more circuits are operable to amplitude modulate said intermediate signal by controlling a current source supplying a power amplifier.

20. The system according to claim 15, wherein said one or more circuits are operable to amplitude modulate said intermediate signal by controlling a voltage source supplying a power amplifier.

21. The system according to claim 15, wherein said expansion is an inverse function of said compression.

* * * * *